United States Patent
Hayashi et al.

(10) Patent No.: US 7,781,262 B2
(45) Date of Patent: Aug. 24, 2010

(54) METHOD FOR PRODUCING SEMICONDUCTOR DEVICE AND SEMICONDUCTOR DEVICE

(75) Inventors: Kenichi Hayashi, Tokyo (JP); Hisashi Kawafuji, Fukuoka (JP); Tatsuyuki Takeshita, Fukuoka (JP); Nobuhito Funakoshi, Fukuoka (JP); Hiroyuki Ozaki, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 743 days.

(21) Appl. No.: 11/588,407

(22) Filed: Oct. 27, 2006

(65) Prior Publication Data
US 2007/0042531 A1 Feb. 22, 2007

Related U.S. Application Data

(62) Division of application No. 10/959,437, filed on Oct. 7, 2004, now Pat. No. 7,166,926.

(30) Foreign Application Priority Data

Oct. 20, 2003 (JP) ............................... 2003-358815

(51) Int. Cl.
H01L 21/00 (2006.01)
(52) U.S. Cl. ........................ 438/112; 438/118; 438/127; 257/E21.504
(58) Field of Classification Search ................ 438/111, 438/112, 118, 127; 257/687, 787, E21.504
See application file for complete search history.

(56) References Cited

U.S. PATENT DOCUMENTS 5,733,802 A * 3/1998 Inoue et al. ................. 438/127
2005/0067719 A1 3/2005 Hayashi et al.

FOREIGN PATENT DOCUMENTS

| JP | 2003-138343 A | 5/2000 |
| KR | 2003-0080900 A | 10/2003 |
| WO | WO 2005/069363 A1 * | 7/2005 |

* cited by examiner

Primary Examiner—Mary Wilczewski
Assistant Examiner—Toniae M Thomas
(74) Attorney, Agent, or Firm—Buchanan Ingersoll & Rooney PC

(57) ABSTRACT

The method of producing a semiconductor device in which chips are resin-molded, including steps of: preparing frames having front and back surfaces and die pads; preparing an insulation resin sheet having a first and a second surfaces; preparing a resin-sealing metal mold having cap pins; mounting the resin sheet inside the resin-sealing metal mold in such a manner that the second surface of the resin sheet contacts an inner bottom surface of the resin-sealing metal mold; mounting power chips on the surfaces of the die pads; positioning the frames on the first surface of the resin sheet in such a manner that the back surfaces of the die pads contact the first surface of the resin sheet; pressing the die pads toward the resin sheet using the cap pins and fixing the die pads; injecting a sealing resin in the resin-sealing metal mold and hardening the sealing resin; and removing the semiconductor device in which the power chips are molded with the sealing resin out from the resin-sealing metal mold. The resin sheet may include a metal foil which is disposed to the second surface.

20 Claims, 6 Drawing Sheets

METHOD FOR PRODUCING SEMICONDUCTOR DEVICE AND SEMICONDUCTOR DEVICE

CROSS-REFERENCE TO RELATED APPLICATIONS

This application is a divisional application of application Ser. No. 10/959,437, filed Oct. 7, 2004 now U.S. Pat. No. 7,166,926.

The disclosure of Japanese Patent Application No. 2003-358815 filed on Oct. 20, 2003 including specification, drawings and claims is incorporated herein by reference in its entirety

BACKGROUND OF THE INVENTION

1. Field of the Invention

This invention relates to a method of producing a semiconductor device, and more particularly, a method of producing a power semiconductor device including a power chip.

2. Description of the Related Art

In a power semiconductor device having a conventional structure, a power chip, an IC chip and the like are each die-bonded on a frame and these chips are sealed with a resin. Since a power chip has large heat dissipation, a cooling fin is attached to the back surface of the semiconductor device for instance to thereby enhance a heat dissipation efficiency. The frames seating the power chips are coated with a resin and insulated from the cooling fin which is attached to the back surface (JP 2000-138343, A).

SUMMARY OF THE INVENTION

While it is necessary for improvement in heat dissipation property that the resin covering the frames seating the power chips, namely, the resin between the back surfaces of the frames seating the power chips and the back surface of the semiconductor device is thin in such a semiconductor device, there is a problem that reduction in thickness of the resin disposed in these portions deteriorates an insulating property.

Noting this, the inventors found that with an insulation resin sheet having a high thermal conductivity fixed to the back surfaces of frames seating power chips in contact with the back surfaces of the frames, it was possible to obtain a semiconductor device exhibiting an enhanced heat dissipation property and an excellent insulating property, thus completing the present invention regarding a method of producing such a semiconductor device.

In short, an object of the present invention is to provide a method of producing a semiconductor device which exhibits an enhanced heat dissipation property and an excellent insulating property.

The present invention is directed to a method of producing a semiconductor device in which chips are resin-molded, including steps of: preparing frames having front and back surfaces and die pads; preparing an insulation resin sheet having a first and a second surfaces; preparing a resin-sealing metal mold having cap pins; mounting the resin sheet inside the resin-sealing metal mold in such a manner that the second surface of the resin sheet contacts an inner bottom surface of the resin-sealing metal mold; mounting power chips on the surfaces of the die pads; positioning the frames on the first surface of the resin sheet in such a manner that the back surfaces of the die pads contact the first surface of the resin sheet; pressing the die pads toward the resin sheet using the cap pins and fixing the die pads; injecting a sealing resin in the resin-sealing metal mold and hardening the sealing resin; and removing the semiconductor device in which the power chips are molded with the sealing resin out from the resin-sealing metal mold. The resin sheet may include a metal foil which is disposed to the second surface.

Using the semiconductor device producing method according to the present invention, it is possible to provide a semiconductor device in which a resin sheet and frames are fixed in a favorable fashion and which therefore exhibits an enhanced heat dissipation property and an excellent insulating property.

DETAILED DESCRIPTION OF THE PREFERRED EMBODIMENTS

Embodiment 1

Figure 1:
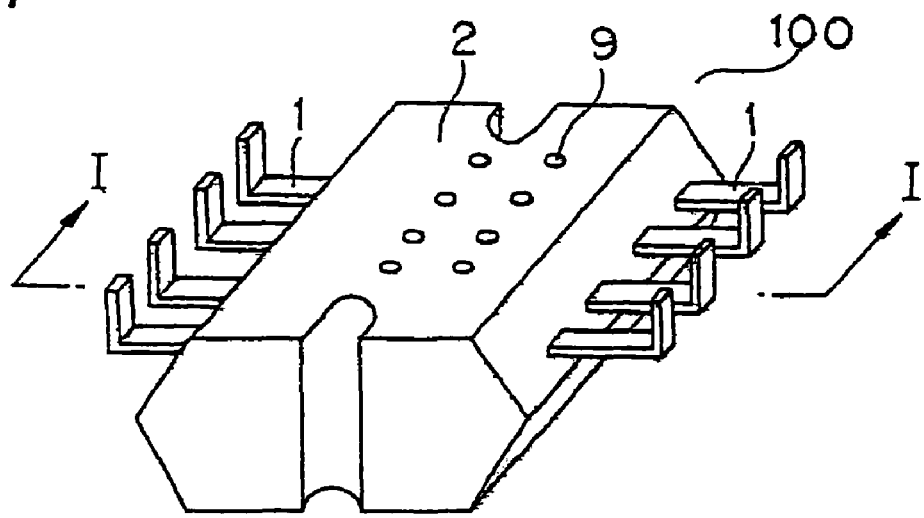
FIG. 1 is a perspective view of the semiconductor device according to the embodiment 1 of the present invention.
Figure 2:
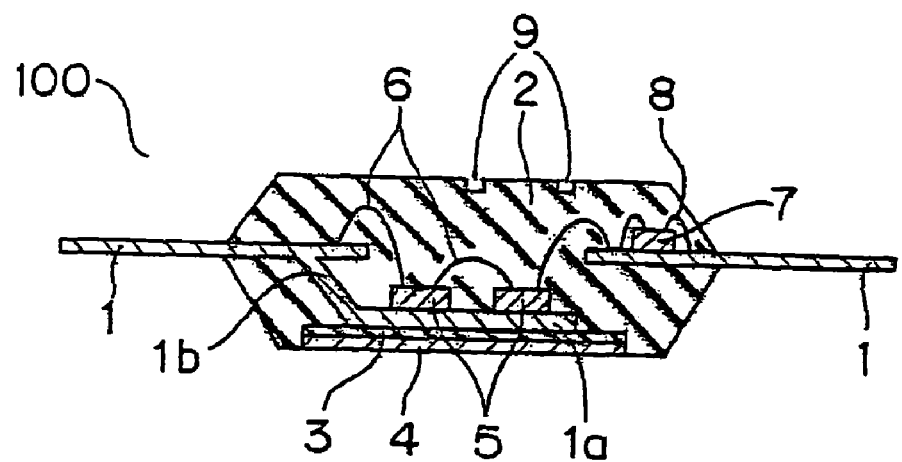
FIG. 2 is a cross sectional view of the semiconductor device according to the embodiment 1 of the present invention.

FIG. 1 is a perspective view of a semiconductor device according to this embodiment of the present invention generally denoted at 100. FIG. 2 is a cross sectional view of the semiconductor device along lines I-I in FIG. 1.

As shown in FIG. 1, the semiconductor device 100 has a resin-molded package structure and includes a mold resin 2 on the both sides of which a plurality of metal frames 1 are disposed. The mold resin 2 is preferably of an epoxy resin.

As shown in FIG. 2, the semiconductor device 100 includes the plurality of frames 1. One frame 1 seats an IC chip 7 such as a logic chip. The other frame 1 includes a die pad portion 1a and a step portion 1b, and the die pad portion 1a seats power chips 5 such as an IGBT and an FW Diode. The power chips 5, the IC chip 7 and the frames 1 are connected with each other by bonding wires 6 and 8 of gold, aluminum and the like, allowing the IC chip 7 control operations of the power chips 5. One or more power chips 5, IC chip 7 and the like may be disposed depending upon the functions of the semiconductor device 100.

The mold resin 2 includes an insulation resin sheet 3 whose back surface seats a metal foil 4 of copper for instance, and the metal foil 4 is exposed in the back surface of the mold resin 2. The insulation resin sheet 3 is preferably formed by an epoxy resin containing fillers. The fillers are made of one or more materials selected from group of $SiO_2$, $Al_2O_3$, $AlN$, $Si_3N_4$ and $BN$. The thermal conductivity of the insulation resin sheet 3 is larger than that of the mold resin 2. The insulation resin sheet 3 alone as it is without the metal foil 4 may be used.

The frames 1 are buried and fixed by the mold resin 2 such that the back surfaces of the die pads 1a are in direct contact with the top surface of the insulation resin sheet 3. In the semiconductor device 100, since the die pads 1a and the insulation resin sheet 3 contact directly each other without the mold resin 2 and the like intermediate between the back surfaces of the die pads 1a and the top surface of the insulation resin sheet 3, the thermal conductivity from the die pads 1a to the insulation resin sheet 3 improves. This improves the heat dissipation property of the power chip 5 which are attached to the top surfaces of the die pads 1a.

Further, there are dents 9 in the top surface of the mold resin 2. The dents 9 are created when cap pins 23 are pulled out at a producing step. The dents 9 will be described in detail when describing the producing steps. Considering the design of a resin-sealing metal mold, it is difficult to pull out the cap pins without creating the dents 9 at all.

A method of producing the semiconductor device 100 will now be described with reference to FIGS. 3A-3G. This producing method includes the following steps 1 through 7. FIGS. 3A-3G are cross sectional views taken along the same direction as the direction I-I shown in FIG. 1.

Figure 3A:
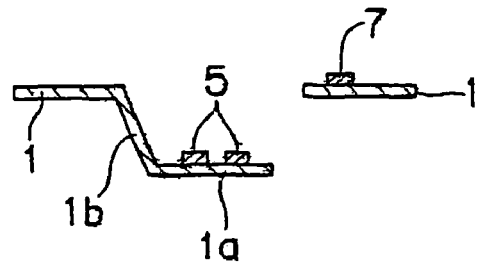
FIGS. 3A-3G are cross sectional views of the producing steps of the semiconductor device according to the embodiment 1 of the present invention.

Step 1: As shown in FIG. 3A, the frames 1 of copper for instance are prepared. This is followed by fixing of the IC chip 7 on one frame 1 and the power chips 5 on the die pad 1a of the other frame 1, each using solder, silver paste, etc.

Figure 3B:
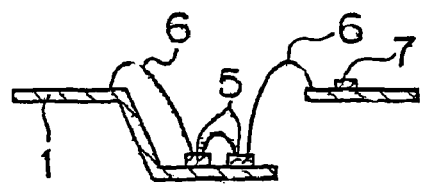

Step 2: As shown in FIG. 3B, using the bonding wires 6 of aluminum, the power chips 5 are connected with each other, the power chips 5 and the frames 1 are connected with each other, and the frames 1 are connected with each other (aluminum wire bonding step). As the bonding wires 6, alloy mainly containing aluminum, or other metal may be used.

Figure 3C:
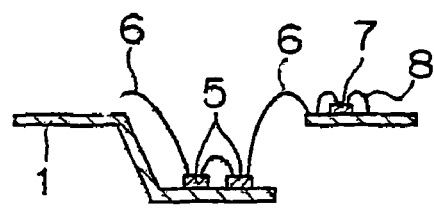

Step 3: As shown in FIG. 3C, using the bonding wires 8 of gold, the IC chip 7 and the frames 1 are connected with each other (gold wire bonding step). As the bonding wires 8, alloy mainly containing gold, or other metal may be used.

While the foregoing has described that the IC chip 7 and the power chips 5 are connected through the frames 1, they may be connected directly. Alternatively, they may be connected by metal plates instead of bonding wires 6 and 8.

Figure 3D:
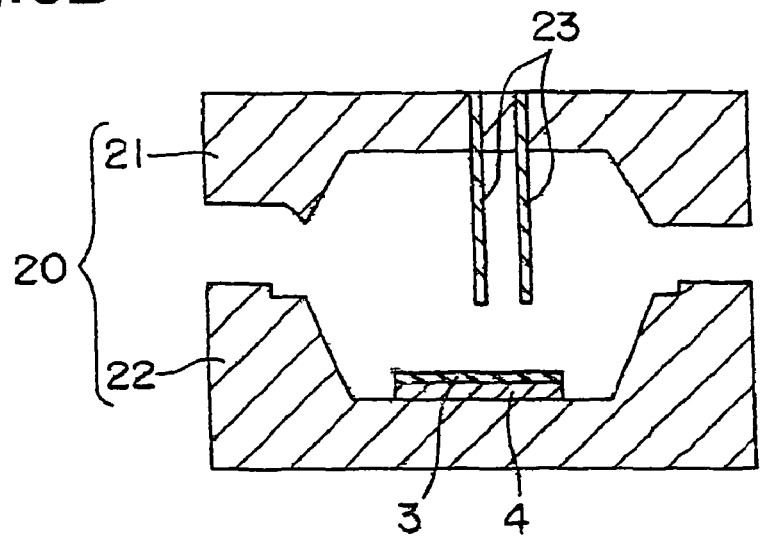

Step 4: As shown in FIG. 3D, a metal mold 20 for resin-sealing is prepared. The metal mold 20 can be separated into an upper metal mold 21 and a lower metal mold 22. The upper metal mold 21 includes the cap pins 23. The cap pins 23 are attached such that they can be pulled out from the upper metal mold 21.

Following this, the insulation resin sheet 3 whose back surface seats the metal foil 4 is prepared and located at a predetermined position inside the metal mold 20. The insulation resin sheet 3 is positioned so that the back surface of the metal foil 4 included in the insulation resin sheet 3 contacts an inner bottom surface of the lower metal mold 22.

Figure 3E:
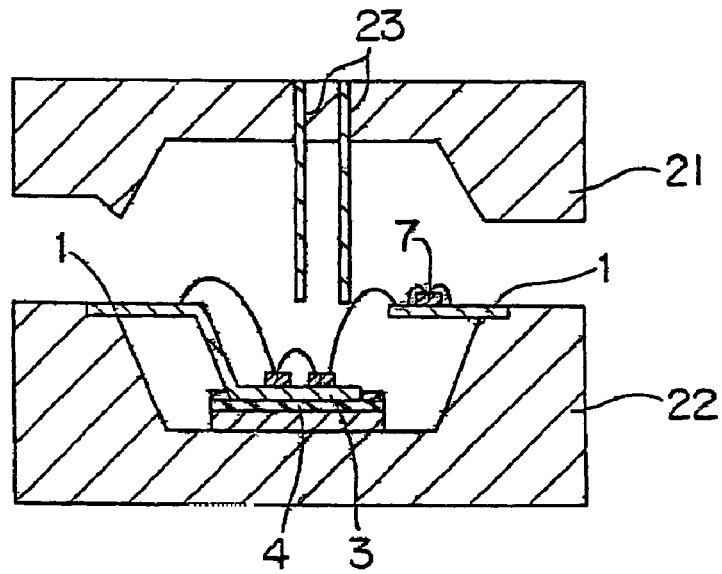

Step 5: As shown in FIG. 3E, the frames 1 seating the power chips 5 and the like are located at predetermined positions inside the metal mold 20. The frames 1 are positioned so that the back surfaces of the die pads 1a of the other frames 1 contact the top surface of the resin sheet 3.

While the foregoing has described that the resin sheet 3 is positioned on the lower metal mold 22 first and the frames 1 mounting the power chips 5 and the like are disposed on the resin sheet 3, the frames 1 mounting the power chips 5 and the like may be temporarily fixed on the resin sheet 3 in advance and the resin sheet 3 may then be positioned on the lower metal mold 22.

Figure 3F:
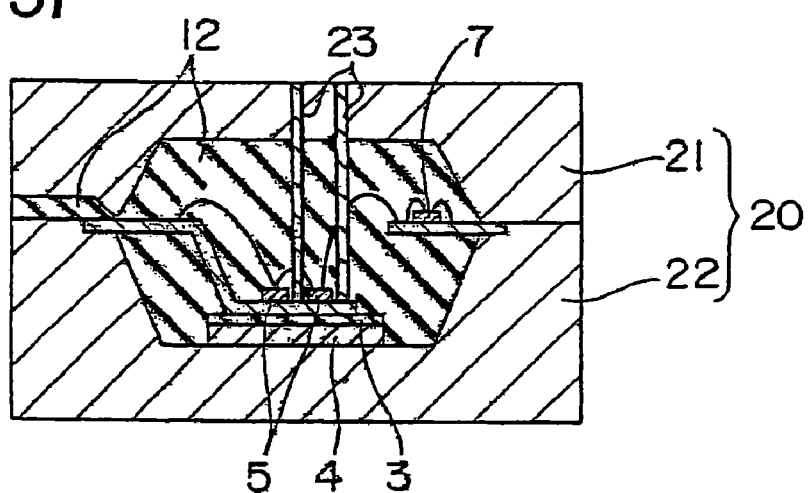

Step 6: As shown in FIG. 3F, the upper metal mold 21 is attached and fixed to the lower metal mold 22. In consequence, the cap pins 32 press at their tips the die pads 1a of the other frames 1 against the top surface of the resin sheet 3.

Further, with the cap pins 23 pressing the die pads 1a, a pressurized sealing resin 12 is injected and held in the resin-sealing metal mold 20. The die pads 1a and the resin sheet 3 are fixed during this.

Figure 4:
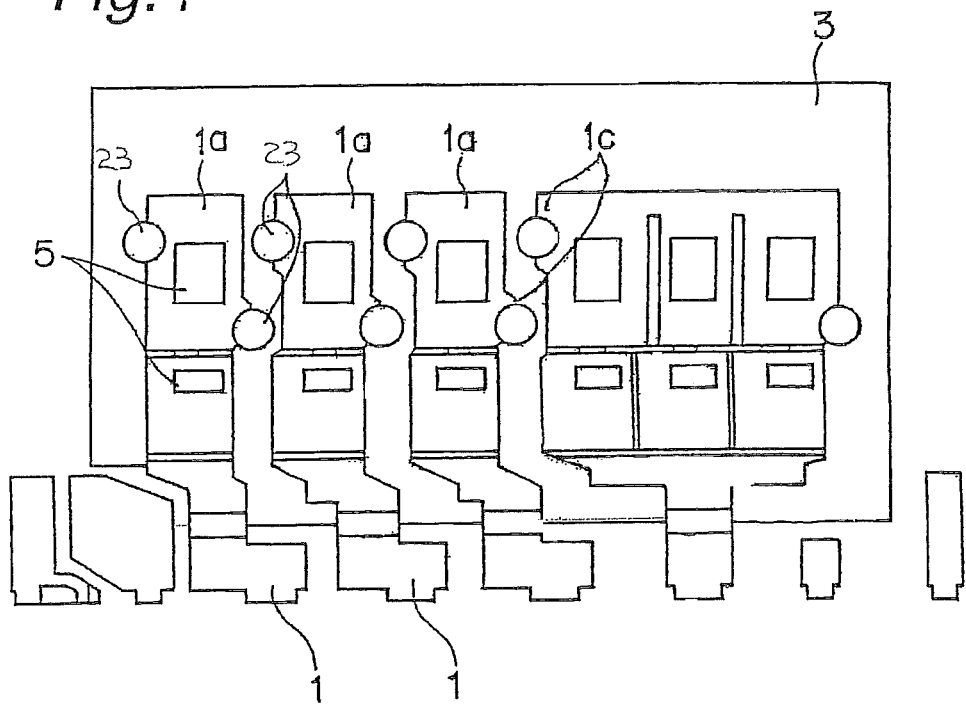
FIGS. 4 and 5 are schematic views of the frames which are arranged inside the resin-sealing metal mold.

FIG. 4 is a schematic view of the frames 1 which are arranged inside the metal mold 20. The portions denoted at 19 are the positions at which the frames 1 are pressed by the tips of the cap pins 23. As the area around the die pads 1a seating the power chips 5 are pressed at one or more locations, the die pads 1a and the resin sheet 3 are brought into perfect contact each other.

In FIG. 4, the die pads 1a seating the power chips 5 include pin pressing sections 1c which are local projections of the die pads 1a. The pin pressing sections 1c protrude between the adjacent die pads 1a, while avoiding mutual contact. By means of the pin pressing sections 1c, the die pads 1a are pressed against the resin sheet 3 securely.

Other than for fixing the die pads 1a at the resin sealing step, the pin pressing sections 1c may be used to fix the frames 1 at the power chip mounting step, the wire bonding steps or the like.

Between the adjacent die pads 1a, there are two cap pins 23 which press the different die pads 1a (i.e., different along the vertical direction in FIG. 4). While the diameter of the cap pins 23 is usually smaller than the gaps between the adjacent die pads 1a, the diameter may be enlarged to the extent not touching the adjacent die pads 1a as shown in FIG. 4.

Since electric potentials are generally different between the adjacent die pads 1a, it is necessary to ensure a certain distance for insulation between the adjacent die pads 1a. In FIG. 4, utilizing the distance for insulation, the cap pins 23 press the die pads 1a with the die pads 1a partially sticking out.

For such an arrangement of the cap pins 23, the cap pins 23 having a large diameter, i.e., strong cap pins 23 which have long lifetime may be used, which does not increase the size of the semiconductor device 100.

The frames 1 are fixed at their ends to the metal mold as shown in FIG. 3F, with the die pads 1a pressed each by the two cap pins 23 as shown in FIG. 4. The die pads 1a are thus pressed stably on the resin sheet 3, whereby the resin sheet 3 and the die pads 1a are fixed in a favorable fashion.

By a transfer mold method, the sealing resin 12 formed by an epoxy resin for example is thereafter injected in the metal mold 20.

Figure 5:
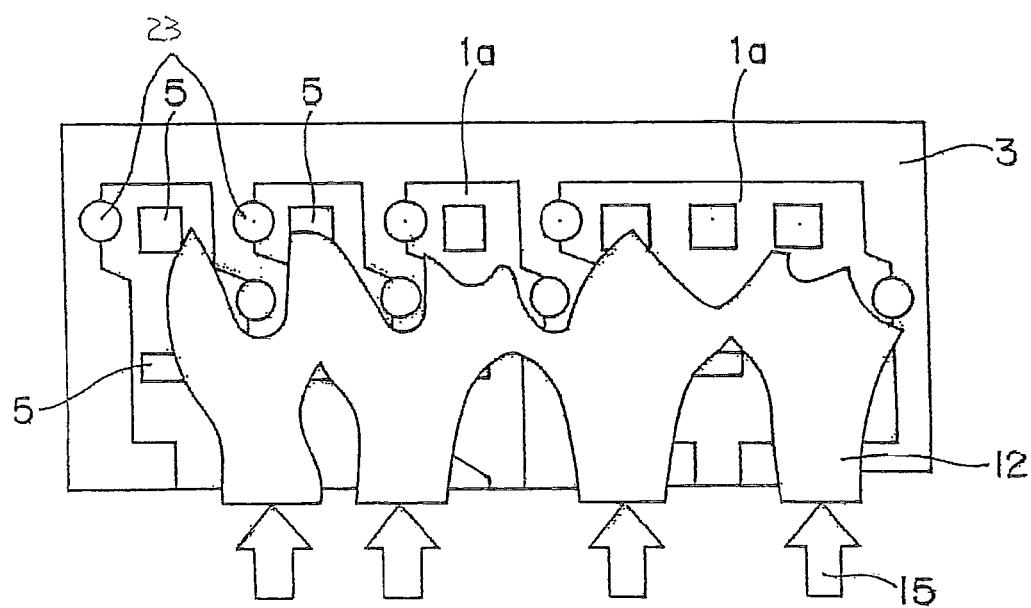

FIG. 5 is a schematic view which shows a step of injecting the sealing resin 12 to the direction of the arrow 15 from below in the fixed state shown in FIG. 4. The sealing resin 12 is injected at a plurality of resin injection inlets into the metal mold 20. Since the cap pins 23 serve as obstacles against the flow of the sealing resin 12 during this, the sealing resin 12 flows dominantly onto the power chips 5 which are free from the cap pins 23. In consequence, pressure acts upon the area of the die pads 1a where the power chips 5 are mounted, and the die pads 1a are pressed against and tightly adhered to the resin sheet 3.

With the cap pins 23 arranged in the gaps between the power chips 5 on the die pads 1a, it is possible to fix the portions of the die pads 1a mounting the power chips to the resin sheet 3 in a favorable manner. Hence, even when the pressing of the die pads 1a by the cap pins 23 is insufficient, the die pads 1a and the resin sheet 3 are fixed favorably. In other words, it is possible to increase the process margin and enhance the stability of producing. This effect becomes more significant as the diameter of the cap pins 23 becomes larger.

Although one cap pin 23 may be assigned to one die pad 1a, one die pad 1a may be pressed with a plurality of (two in FIG. 4) cap pins 23 as shown in FIG. 5. This increases the stability of the pressing. In addition, since a plurality of cap pins 23 are arranged utilizing the dead spaces which are present between the die pads 1a in the arrangement shown in FIG. 4, the size of the semiconductor device does not increase even when more cap pins 23 are used.

Next, before the sealing resin 12 hardens, the cap pins 23 are pulled out from the upper metal mold 21 until the tips of the cap pins 23 are positioned slightly below the top surface of the mold resin 2, and the cap pins 23 are held in this condition. In this case, while the holes left by the cap pins 23 are closed by the sealing resin 12, the dents 9 are created in the top surface of the mold resin 2. It is difficult to pull out the cap pins without creating the dents 9 at all, owing to the structure of the metal mold 20.

Figure 3G:
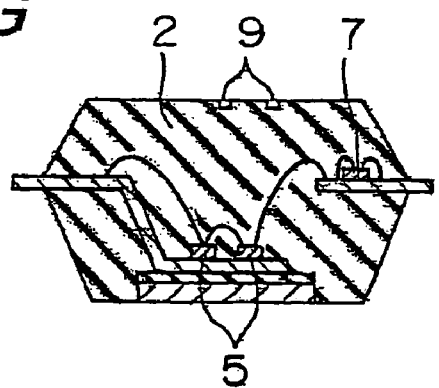

Step 7: As shown in FIG. 3G, after releasing from the metal mold 20, post cure for completely hardening the mold resin, cutting of excessive frame portions such as tie bars, and the like are executed. The frames (external terminals) 1 are further molded, thereby completing the semiconductor device 100 shown in FIG. 1.

Embodiment 2

Figure 6:
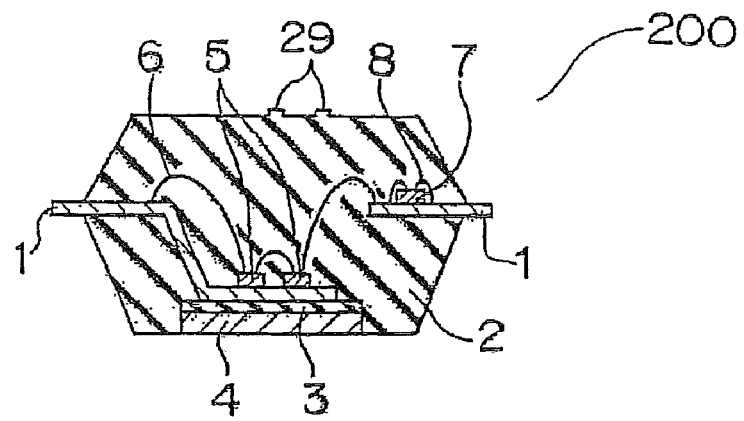
FIG. 6 is a cross sectional view of the semiconductor device according to the embodiment 2 of the present invention.

FIG. 6 is a cross sectional view of a semiconductor device according to this embodiment of the present invention generally denoted at 200, taken along the same direction as the direction I-I in FIG. 1. In FIG. 6, the same reference symbols as those in FIGS. 1 and 2 denote the same or corresponding portions.

In the semiconductor device 200, projections 29 are formed instead of the dents 9, at the same positions as those of the dents 9 of the semiconductor device 100. The projections 29 are formed as the cap pins 23 are pulled out from the upper metal mold 21 until the tips of the cap pins 23 are positioned slightly above the top surface of the mold resin 2 and the cap pins 23 are held as such at the step 6 of the producing method of the semiconductor device 100 described above with the sealing resin 12 hardened to a certain extent.

Since the semiconductor device 200 includes such projections 29, the strength of the mold resin 2, especially the bending strength, improves.

Embodiment 3

Figure 7:
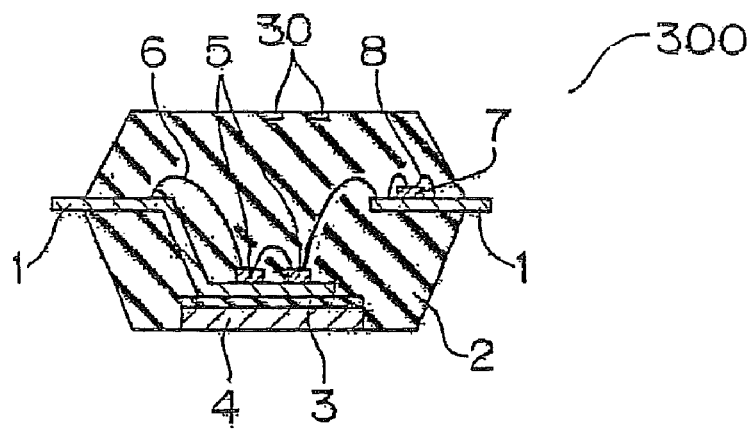
FIG. 7 is a cross sectional view of the semiconductor device according to the embodiment 3 of the present invention.

FIG. 7 is a cross sectional view of a semiconductor device according to this embodiment of the present invention generally denoted at 300, taken along the same direction as the direction I-I in FIG. 1. In FIG. 7, the same reference symbols as those in FIGS. 1 and 2 denote the same or corresponding portions.

The semiconductor device 300 has a structure that the dents 9 of the semiconductor device 100 are buried with a resin 30. The semiconductor device 300 is otherwise the same in structure as the semiconductor device 100. Burying with the resin 3 is accomplished using a potting method for instance.

As compared with a structure that the dents 9 are not buried, the strength and especially the bending strength improves in the semiconductor device 300.

Embodiment 4

Figure 8:
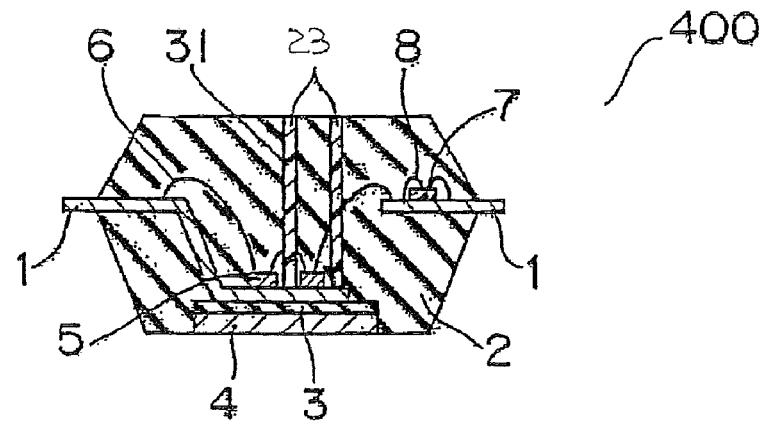
FIG. 8 is a cross sectional view of the semiconductor device according to the embodiment 4 of the present invention.

FIG. 8 is a cross sectional view of a semiconductor device according to this embodiment of the present invention generally denoted at 400, taken along the same direction as the direction I-I in FIG. 1. In FIG. 8, the same reference symbols as those in FIGS. 1 and 2 denote the same or corresponding portions.

The semiconductor device 400 is produced using the metal mold 20 in which the cap pins 23 are fixed to the upper metal mold 21, e.g., a metal mold in which the cap pins 23 and the upper metal mold 21 are integrated with each other. Hence, as the sealing resin 12 hardens with the cap pins 23 pressing the die pads 1a and the upper metal mold 21 is removed at the step 6 (FIG. 3F) described above, hole portions 31 are created in the mold resin 2.

In the semiconductor device 400, the hole portions 31 are filled with a resin 32. Filling with the resin 32 is accomplished using a potting method for instance.

The frames 1 exposed at the bottom of the hole portions 31 are covered with an injected resin 32, thus preventing corrosion and the like of the frames 1.

As the semiconductor device 400 is produced using the metal mold 20 in which the cap pins 23 are fixed to the upper metal mold 21, the producing steps are simplified and a producing cost is reduced.

Embodiment 5

Figure 9:
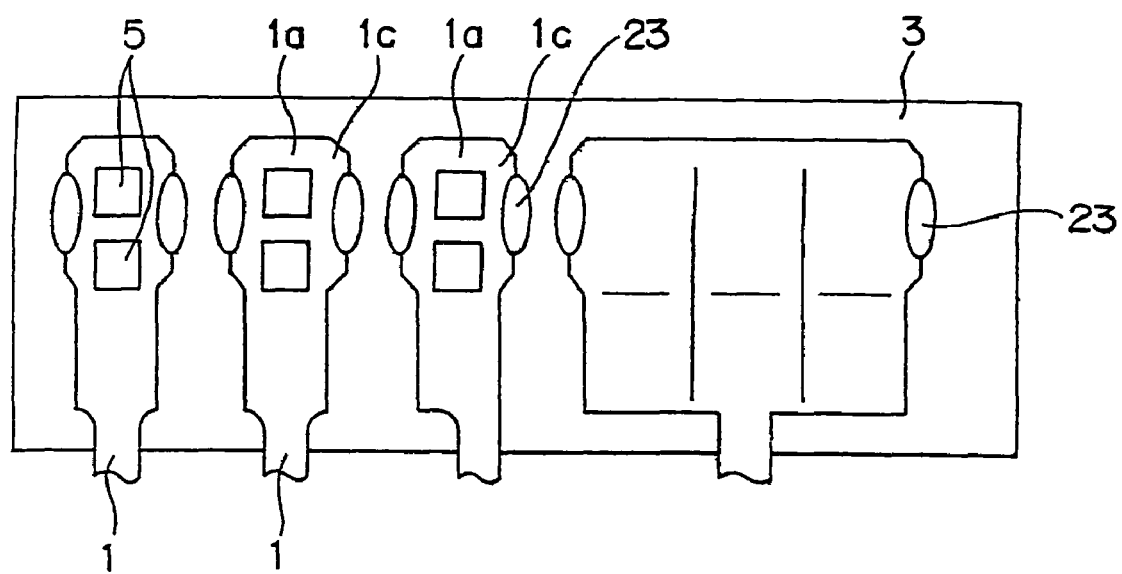
FIG. 9 is a schematic view of the frames which are arranged inside the resin-sealing metal mold.

FIG. 9 is a schematic view similar to FIG. 4, showing the frames 1 which are arranged inside the metal mold 20 for resin-sealing. In FIG. 9, the pin pressing sections 1c are disposed on the both sides of the respective die pads 1a. The cross sectional shape of the cap pins 23 is oval.

Owing to these shapes of the pin pressing sections 1c and the cap pins 23, the die pads 1a are pressed stably on the resin sheet 3. The resin sheet 3 and the die pads 1a are thus fixed in a favorable fashion.

What is claimed is:

1. A method of producing a semiconductor device in which chips are resin-molded, comprising:
    a step of preparing frames having front and back surfaces and die pads;
    a step of preparing an insulation resin sheet having a first and a second surfaces;
    a step of preparing a resin-sealing mold having cap pins attached thereto;
    a step of mounting the resin sheet inside the resin-sealing mold in such a manner that the second surface of the resin sheet contacts an inner bottom surface of the resin-sealing mold;
    a step of mounting power chips on the surfaces of the die pads;
    a step of positioning the frames on the first surface of the resin sheet in such a manner that the back surfaces of the die pads contact the first surface of the resin sheet;
    a fixing step of pressing the die pads toward the resin sheet using the cap pins and fixing the die pads;
    a hardening step of injecting a sealing resin in the resin-sealing mold and hardening the sealing resin; and
    a step of removing the semiconductor device in which the power chips are molded with the sealing resin out from the resin-sealing mold.

2. The producing method of claim 1, wherein the fixing step is a step at which each one of the die pads is pressed with a plurality of the cap pins.

3. The producing method of claim 1, wherein the fixing step is a step at which the die pads are fixed with the cap pins which are disposed between the die pads which are adjacent to each other.

4. The producing method of claim 1, wherein the fixing step is a step at which two adjacent ones of the die pads are each pressed with at least two such cap pins which are disposed between these two die pads.

5. The producing method of claim 1, wherein the fixing step is a step at which the cap pins press pin pressing sections which stick out from two adjacent ones of the die pads in such a manner that the pin pressing sections do not overlap each other.

6. The producing method of claim 1, wherein the fixing step is a step at which the die pads are pressed with portions of the cap pins.

7. The producing method of claim 1, wherein the fixing step is a step at which the die pads are pressed by using the cap pins whose diameter is smaller than a gap between two adjacent ones of the die pads.

8. The producing method of claim 1, wherein the fixing step is a step at which the die pads are pressed with a plurality of the cap pins which are disposed between two adjacent ones of the die pads in an arrangement direction which is along the die pads, and the hardening step is a step at which the sealing resin is injected toward the arrangement direction.

9. A method of producing a semiconductor device in which chips are resin-molded, comprising:
- a step of preparing frames having front and back surfaces and die pads;
- a step of preparing an insulation resin sheet having a first and a second surfaces;
- a step of preparing a resin-sealing mold having cap pins attached thereto;
- a step of mounting power chips on the surfaces of the die pads;
- a step of mounting the frames on the first surface of the resin sheet in such a manner that the back surfaces of the die pads contact the first surface of the resin sheet;
- a step of mounting the resin sheet now seating the die pads inside the resin-sealing mold in such a manner that the second surface of the resin sheet contacts an inner bottom surface of the resin-sealing mold;
- a fixing step of pressing the die pads toward the resin sheet using the cap pins, and fixing the die pads;
- a hardening step of injecting a sealing resin in the resin-sealing mold and hardening the sealing resin; and
- a step of removing the semiconductor device in which the power chips are molded with the sealing resin out from the resin-sealing mold.

10. The producing method of claim 9, wherein the fixing step is a step at which each one of the die pads is pressed with a plurality of the cap pins.

11. The producing method of claim 9, wherein the fixing step is a step at which the die pads are fixed with the cap pins which are disposed between the die pads which are adjacent to each other.

12. The producing method of claim 9, wherein the fixing step is a step at which two adjacent ones of the die pads are each pressed with at least two such cap pins which are disposed between these two die pads.

13. The producing method of claim 9, wherein the fixing step is a step at which the cap pins press pin pressing sections which stick out from two adjacent ones of the die pads in such a manner that the pin pressing sections do not overlap each other.

14. The producing method of claim 9, wherein the fixing step is a step at which the die pads are pressed with portions of the cap pins.

15. The producing method of claim 9, wherein the fixing step is a step at which the die pads are pressed by using the cap pins whose diameter is smaller than a gap between two adjacent ones of the die pads.

16. The producing method of claim 9, wherein the fixing step is a step at which the die pads are pressed with a plurality of the cap pins which are disposed between two adjacent ones of the die pads in an arrangement direction which is along the die pads, and the hardening step is a step at which the sealing resin is injected toward the arrangement direction.

17. The producing method of claim 1, wherein the hardening step includes pulling the cap pins out of the mold before the sealing resin hardens.

18. The producing method of claim 9, wherein the hardening step includes pulling the cap pins out of the mold before the sealing resin hardens.

19. The producing method of claim 1, wherein the molds are formed from a metal.

20. The producing method of claim 9, wherein the molds are formed from a metal.

* * * * *